(12) United States Patent
Jang et al.

(10) Patent No.: US 10,411,052 B2
(45) Date of Patent: Sep. 10, 2019

(54) IMAGE SENSOR

(71) Applicant: Samsung Electronics Co., Ltd., Suwon-si, Gyeonggi-do (KR)

(72) Inventors: Dong-young Jang, Suwon-si (KR); Sung-hoon Oh, Seoul (KR); Yi-tae Kim, Hwaseong-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/850,266

(22) Filed: Dec. 21, 2017

(65) Prior Publication Data

US 2018/0190695 A1  Jul. 5, 2018

(30) Foreign Application Priority Data

Jan. 5, 2017 (KR) .......................... 10-2017-0002063

(51) Int. Cl.
*H01L 27/146* (2006.01)

(52) U.S. Cl.
CPC .... *H01L 27/14607* (2013.01); *H01L 27/1461* (2013.01); *H01L 27/1463* (2013.01); *H01L 27/14614* (2013.01); *H01L 27/14645* (2013.01); *H01L 27/14689* (2013.01); *H01L 27/14621* (2013.01); *H01L 27/14627* (2013.01)

(58) Field of Classification Search
CPC ........... H01L 27/14607; H01L 27/1461; H01L 27/14614; H01L 27/1463
See application file for complete search history.

(56) References Cited

U.S. PATENT DOCUMENTS

| 8,614,759 | B2 | 12/2013 | Watanabe et al. |
| 9,337,224 | B2 | 5/2016 | Ihara |
| 9,356,067 | B2 | 5/2016 | Shin |
| 9,385,157 | B2 | 7/2016 | Jung et al. |
| 2011/0169991 | A1* | 7/2011 | Ku .................... H01L 27/14607 348/308 |
| 2013/0258311 | A1 | 10/2013 | Mase et al. |
| 2015/0228684 | A1* | 8/2015 | Yamashita ........ H01L 27/14643 257/292 |
| 2015/0243700 | A1 | 8/2015 | Morooka |

(Continued)

FOREIGN PATENT DOCUMENTS

KR  2014-0093029 A  7/2014

*Primary Examiner* — Walter H Swanson
(74) *Attorney, Agent, or Firm* — Harness, Dickey & Pierce, P.L.C.

(57) ABSTRACT

An image sensor according to inventive concepts includes a substrate including a first surface, a second surface opposite to the first surface, and a unit pixel having four sides; a photoelectric conversion device formed in the unit pixel; a floating diffusion region formed contacting the first surface in the unit pixel and overlapping with a center region of the photoelectric conversion device in a first direction perpendicular to the first surface; a gate electrode, in the unit pixel, overlapping with some portions of the floating diffusion region and formed along a first set of sides that comprises at least one side of the four sides; and a set of transistors, in the unit pixel, overlapping with some portions of the floating diffusion region and formed along a second set of sides that comprises at least two sides of the four sides, which are different from the first set of sides.

20 Claims, 16 Drawing Sheets

(56) References Cited

U.S. PATENT DOCUMENTS

| | | | |
|---|---|---|---|
| 2015/0279883 A1* | 10/2015 | Manouvrier | H01L 27/14614 257/225 |
| 2015/0373255 A1* | 12/2015 | Kim | H01L 27/14607 348/349 |
| 2016/0020236 A1 | 1/2016 | Tanaka et al. | |
| 2016/0104740 A1* | 4/2016 | Kim | H01L 27/14645 257/292 |
| 2016/0218138 A1 | 7/2016 | Oishi | |
| 2017/0125474 A1* | 5/2017 | Roy | H01L 27/1461 |

* cited by examiner

IMAGE SENSOR

CROSS-REFERENCE TO RELATED APPLICATION

This application claims the benefit of Korean Patent Application No. 10-2017-0002063, filed on Jan. 5, 2017, in the Korean Intellectual Property Office, the disclosure of which is incorporated herein in its entirety by reference.

BACKGROUND

Inventive concepts relate to an image sensor, and more particularly, to an image sensor which improves charge transfer efficiency.

A pixel array comprising a complementary metal-oxide semiconductor (CMOS) image sensor (CIS) may include a photoelectric conversion device in each pixel. The photoelectric conversion device may generate an electric signal. The electric signal may vary according to an amount of incident light and the CIS may generate an image by processing the electric signal.

As the demand for a high-definition image has recently increased, a pixel comprising a CMOS image sensor is desired to be miniaturized. However, charge transfer efficiency of a device included in a miniaturized pixel is reduced and accordingly, image quality may degrade. Thus, improvement is desired.

SUMMARY

Some example embodiments of inventive concepts provide an image sensor in which charge transfer efficiency of a miniaturized pixel is improved and accordingly, image accuracy is improved.

According to an example embodiment of inventive concepts, there is provided set of sides an image sensor including a substrate comprising a first surface, a second surface opposite to the first surface, and a unit pixel having four sides, a photoelectric conversion device in the unit pixel, a floating diffusion region contacting the first surface in the unit pixel and overlapping with a center region of the photoelectric conversion device in a first direction perpendicular to the first surface, a gate electrode in the unit pixel, overlapping with some portions of the floating diffusion region and along a first set of sides, the first set of sides including at least one side of the four sides, and a set of transistors in the unit pixel, overlapping with some portions of the floating diffusion region and along a second set of sides that comprises at least two sides of the four sides, the first set of sides and the second set of sides not having a common side.

According to another example embodiment of inventive concepts, there is provided an image sensor including a substrate comprising a first surface and a second surface opposite to the first surface, a photoelectric conversion device in the substrate, a floating diffusion region in the substrate, contacting the first surface and overlapping with a center region of the photoelectric conversion device in a first direction perpendicular to the first surface, a gate electrode in the substrate, overlapping with a first portion that is some portions of a perimeter of the floating diffusion region, and a set of transistors in the substrate, overlapping with a portion that is some portions of the perimeter of the floating diffusion region and different from the first portion in at least some portions. The first and second portions are greater than or equal to a half of the whole side surface of the floating diffusion region According to another example embodiment of inventive concepts, there is provided an image sensor including a substrate including a first surface and a second surface, the substrate including at least one unit pixel, a photoelectric conversion device in the unit pixel and adjacent to the first surface, a floating diffusion region at least partially in a center of the unit pixel and connected to the second surface, and a transfer gate on a first side of the floating diffusion region. The transfer gate includes a gate dielectric adjacent to the floating diffusion region in a first direction and adjacent to the photoelectric conversion in a second direction, perpendicular to the first direction.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

Figure 1:
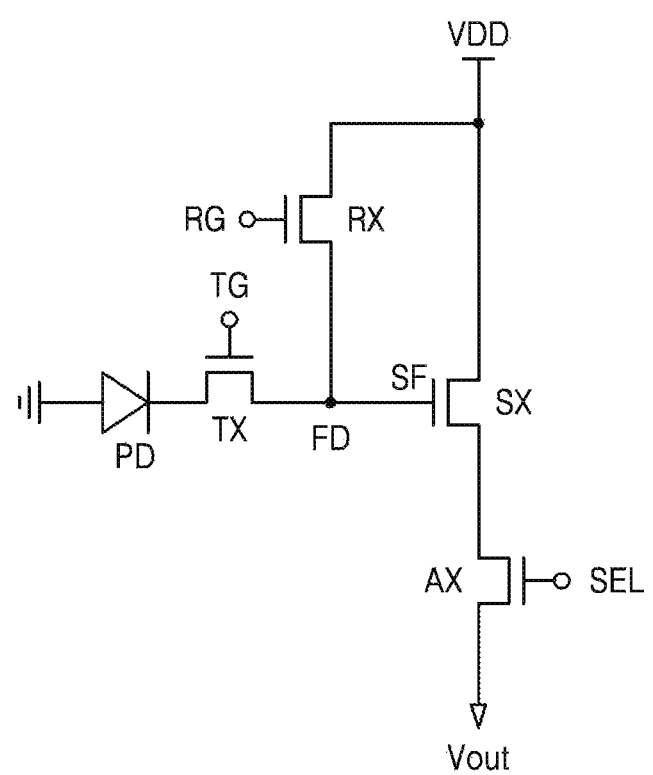
FIG. 1 illustrates a circuit diagram showing a unit pixel included in an image sensor according to some example embodiments of inventive concepts.

FIG. 1 illustrates a circuit diagram showing a unit pixel included in an image sensor according to example embodiments of inventive concepts.

Referring to FIG. 1, each of, or at least some of, unit pixels in an image sensor may include a photoelectric conversion device PD, a transfer transistor TX, a source follower transistor SX, a reset transistor RX, and a selection transistor AX. The transfer transistor TX, the source follower transistor SX, the reset transistor RX, and the selection transistor AX may respectively include a transfer gate electrode TG, a source follower gate electrode SF, a reset gate electrode RG, and a selection gate electrode SEL.

The photoelectric conversion device PD may be or may include a photodiode including an N-type impurity region and a P-type impurity region. The photoelectric conversion device PD may be or may include a photosensitive device having a characteristic that a photocurrent increases linearly according to light intensity input in a reverse bias. For example, when or if the photoelectric conversion device PD is exposed to light and electrically floated from external parts, the photoelectric conversion device PD may generate an electron-hole pair. A hole and an electron may move to and accumulate in a P-type impurity injection region and an N-type impurity injection region, respectively.

The transfer transistor TX may connect or disconnect the photoelectric conversion device PD to a floating diffusion region FD according to a voltage of the transfer gate electrode TG. While the photoelectric conversion device PD accumulates electrons corresponding to light, the transfer transistor TX may be turned off to electrically disconnect the photoelectric conversion device PD from the floating diffusion region FD. When the photoelectric conversion device PD completes absorbing light, the transfer transistor TX may be turned on to transfer charge accumulated in the photoelectric conversion device PD to the floating diffusion region FD. A gate bias of the source follower transistor SX may change proportionally to an amount of the accumulated charge, thus causing a change in a source potential of the source follower transistor SX. In this case, when the selection transistor AX is turned on, a signal generated by charge may be read via a column line.

The floating diffusion region FD may be reset before a changed voltage of the photoelectric conversion device PD is applied to the floating diffusion region FD. For example, when light is blocked, a supply voltage VDD may be applied to a drain of the reset transistor RX and a drain of the source follower transistor SX and the reset transistor RX may be turned on, and thus residual charges in the floating diffusion region FD may be emitted. A reset voltage of the floating diffusion region FD may be amplified by the source follower transistor SX and externally output when the selection transistor AX is turned on. An analog voltage corresponding to the reset voltage of the floating diffusion region FD may be transmitted to an external read circuit (not shown).

Once the reset voltage of the floating diffusion region FD is completely output, the reset transistor RX may be turned off and the transfer transistor TX may be turned on. Thus, the charges accumulated in the photoelectric conversion device PD may be transferred to the floating diffusion region FD. A changed voltage of the floating diffusion region FD may be externally output via the source follower transistor SX and the selection transistor AX. An analog voltage Vout corresponding to the changed voltage of the floating diffusion region FD may be transmitted to an external read circuit (not shown). An order of receiving the reset voltage and a voltage generated by the photoelectric conversion device PD may change.

The read circuit may receive the reset voltage of the floating diffusion region FD and the voltage generated by the photoelectric conversion device PD, and may calculate an amount of light sensed by the photoelectric conversion device PD based on a difference between the reset voltage and the voltage generated by the photoelectric conversion device PD.

As described above, the photoelectric conversion device PD may transfer charges to the floating diffusion region FD when or if the transfer transistor TX is turned on. Accordingly, a charge transfer path formed between the photoelectric conversion device PD and the floating diffusion region FD by the transfer gate electrode TG may change depending on a detailed structure of the photoelectric conversion device PD, the transfer transistor TX, and the floating diffusion region FD.

An image sensor according to inventive concepts may include a structure in which a horizontal charge transfer path is removed and a vertical charge transfer path is increased (e.g. maximized) from the photoelectric conversion device PD to the floating diffusion region FD. Thus, a charge transfer path may be reduced to improve charge transfer efficiency.

Additionally, a region used to be a horizontal charge transfer path may be utilized for the source follower transistor SX, the reset transistor RX, and the selection transistor AX to increase areas thereof. Thus, charge transfer efficiency may be improved and noise of a sensed image may be reduced. A detailed structure will be described with reference to FIGS. 2 to 8.

The photoelectric conversion device PD may be or may include a photoelectric conversion device 103 of FIGS. 1 to 9G and the transfer gate electrode TG may be transfer gate electrodes 111, 411, and 511 of FIGS. 1 to 9G. The source follower transistor SX, the reset transistor RX, and the selection transistor AX may respectively correspond to first and second transistors 115A, 115B, 415A, and 415B of FIGS. 1 to 9G.

Figure 2:
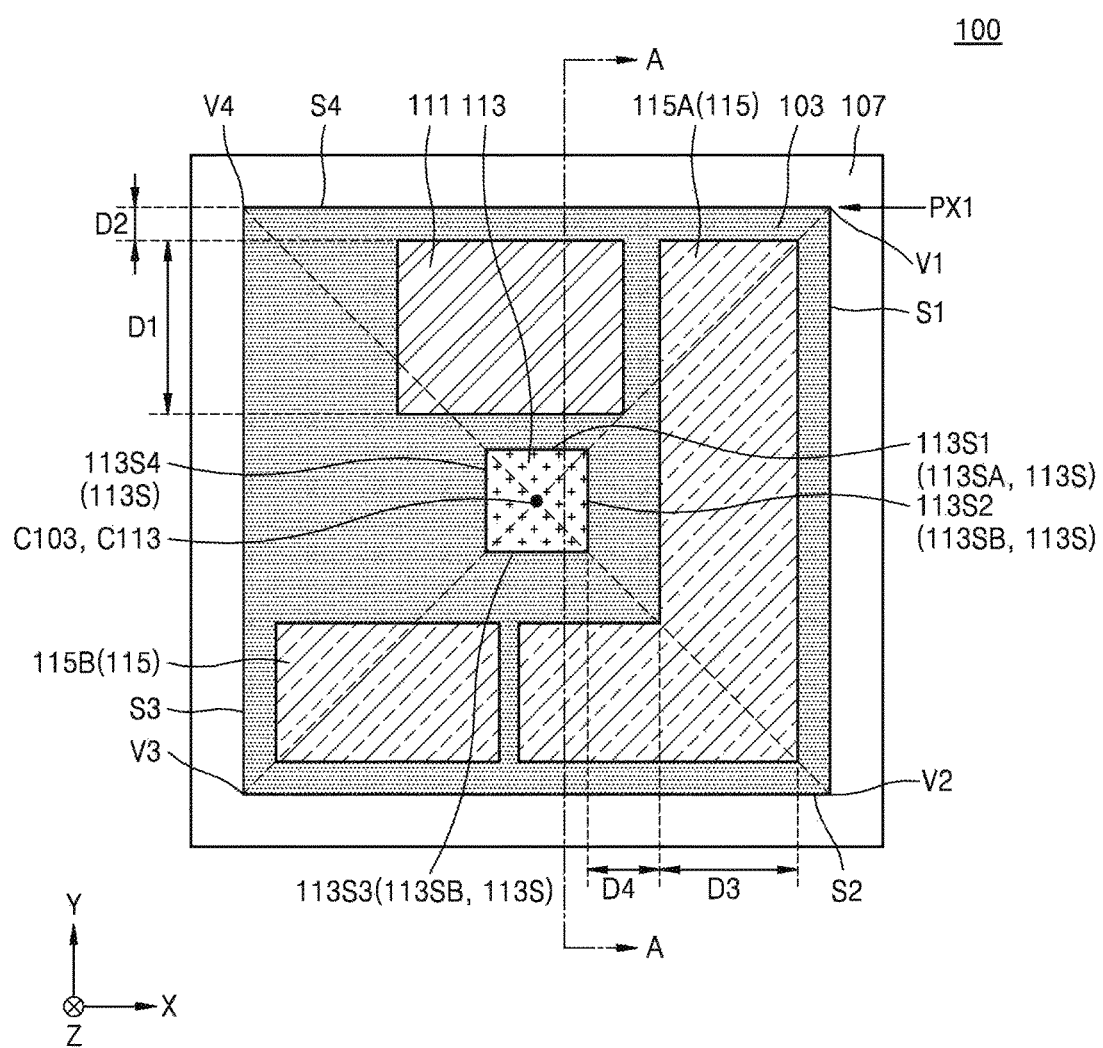
FIG. 2 illustrates a layout showing a unit pixel PX1 included in an image sensor according to some example embodiments of inventive concepts.
Figure 3:
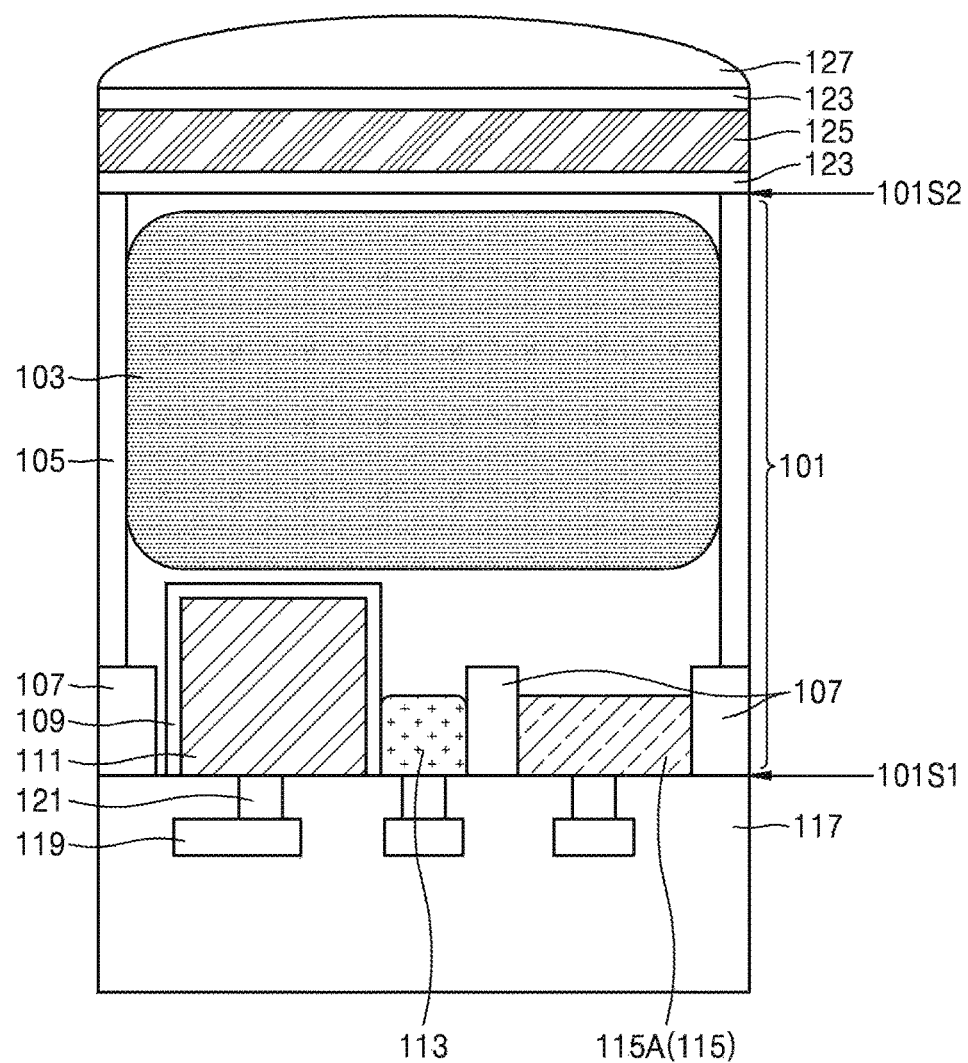
FIG. 3 illustrates a cross-sectional view of the unit pixel PX1 included in the image sensor according to some example embodiments of inventive concepts, taken along line A-A of FIG. 2.
Figure 4:
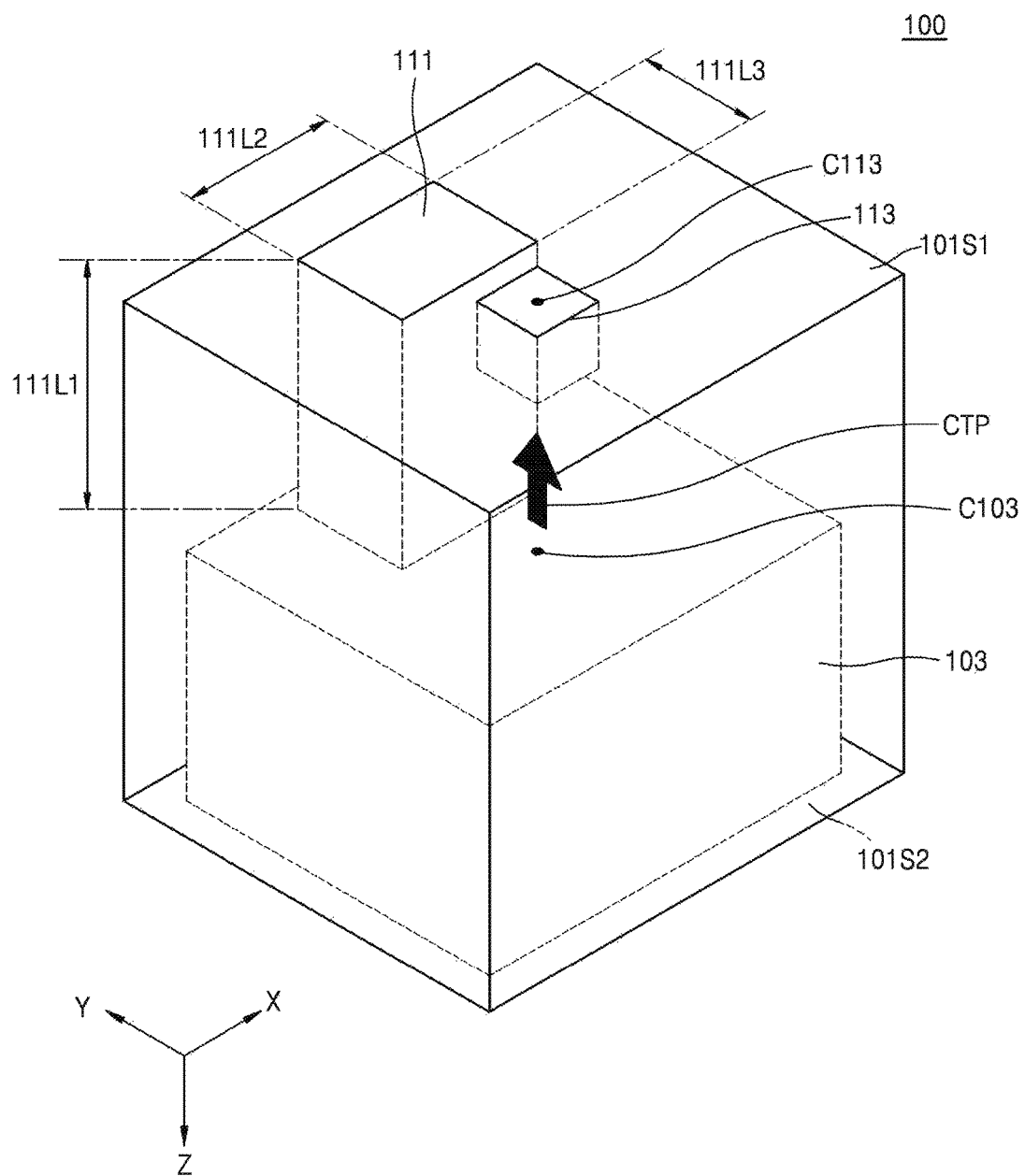
FIG. 4 illustrates a perspective view showing some portions of the unit pixel PX1 included in the image sensor according to some example embodiments of inventive concepts.

FIG. 2 illustrates a layout a unit pixel PX1 included in an image sensor 100 according to example embodiments of inventive concepts. FIG. 3 illustrates a cross-sectional view of the unit pixel PX1 included in the image sensor 100 according to example embodiments of inventive concepts, taken along line A-A of FIG. 2. FIG. 4 illustrates a perspective view showing some portions of the unit pixel PX1 included in the image sensor 100 according to example embodiments of inventive concepts.

Referring to FIGS. 2 and 3, the image sensor 100 may include a substrate 101, the photoelectric conversion device 103 in (e.g. formed in) the substrate 101, a floating diffusion region 113 overlapping a center region C103 of the photoelectric conversion device 103, a transfer gate electrode 111 overlapping some side surfaces, or some portions of the perimeter of, the floating diffusion region 113, and a transistor group, or set of transistors 115 overlapping other side surfaces of the floating diffusion region 113.

The substrate 101 may include a first surface 101S1 and a second surface 101S2 opposite to the first surface 101S 1. The substrate 101 may include a semiconductor wafer such as a silicon substrate, a bulk substrate, an epitaxial substrate, and/or a silicon-on-insulator (SOI) substrate. A pixel circuit layer 117 may be on (e.g. formed on) the first surface 101 S1 of the substrate 101, and light may be incident onto the second surface 101S2.

The substrate 101 may include a unit pixel PX1 having a shape of four or more sides, e.g. a quadrilateral shape having first to fourth vertices V1, V2, V3, and V4 and first to fourth sides S1, S2, S3, and S4, and defined by deep and shallow device isolation layers 105 and 107. For example, the substrate 101 may include the deep and shallow device isolation layers 105 and 107 having a mesh structure in a plane view and may include a plurality of unit pixels PX1.

The deep and shallow device isolation layers 105 and 107 may extend from the first surface 101S1 to the second surface 101S2. The deep and shallow device isolation layers 105 and 107 may include the shallow device isolation layer 107 extended from the first surface 101S and the deep device isolation layer 105 extended from the second surface 101S2 to the shallow device isolation layer 107.

The photoelectric conversion device 103 may be in (e.g. formed in) the substrate 101. The photoelectric conversion device 103 may generate a photoelectric current by absorbing light incident through the second surface 101S2. The substrate 101 may be or may include a semiconductor substrate doped with a first type impurity, and the photoelectric conversion device 103 may be formed by an ion implantation process by doping the semiconductor substrate with a second type impurity, the second type impurity being different from the first type impurity for the substrate 101. For example, the photoelectric conversion device 103 may be or may include a photodiode.

In some example embodiments, when the photoelectric conversion device 103 is formed by doping a P-type substrate with N-type impurities, the photoelectric conversion device 103 may collect an electron of an electron-hole pair. In other example embodiments, when the photoelectric conversion device 103 is formed by doping an N-type substrate with P-type impurities, the photoelectric conversion device 103 may collect holes of an electron-hole pair.

Also, the floating diffusion region 113 may contact the first surface 101S1 of the substrate 101 and overlap a center region C103 of the photoelectric conversion device 103 in a first direction (Z direction) perpendicular to the first surface 101S1.

In general, a transfer gate electrode may be close to (e.g. formed closed to) a photoelectric conversion device so that charges accumulated in the photoelectric conversion device may be easily transferred to a floating diffusion region. In this regard, the transfer gate electrode may be formed in a central region of the photoelectric conversion device, and the floating diffusion region may be around the edge of a unit pixel.

In this case, a region where a maximum voltage is generated in the photoelectric conversion device may be the central region of the photoelectric conversion device and thus, a channel region defined by the transfer gate electrode may be along a surface of the transfer gate electrode in a direction perpendicular to the central region of the photoelectric conversion device. In this regard, charges accumulated in the photoelectric conversion device may be transferred to a first surface of a substrate along the channel region having a vertical path. However, since the floating diffusion region is around the edge of the unit pixel, the charges may move in an additional horizontal path along the first surface of the substrate. A moving distance of the charges becomes longer, which reduces charge transfer efficiency and an image may be distorted due to a delay in transferring charge.

In the image sensor 100 according to example embodiments of inventive concepts, the floating diffusion region 113 may overlap the center region C103 of the photoelectric conversion device 103. Thus, by also referring to FIG. 4, a horizontal path may be removed and a vertical path may be increased (e.g. maximized) for a charge transfer path CTP formed from the photoelectric conversion device 103 to the floating diffusion region 113. As a result, the charge transfer path CTP is shortened to improve charge transfer efficiency and prevent image distortion.

Although with reference to FIGS. 2 and 3, the floating diffusion region 113 is described as having a quadrilateral shape, embodiments are not limited thereto. The floating diffusion region 113 may have various shapes, such as a circular shape, that are formed by a process.

In some example embodiments, a central region C113 of the floating diffusion region 113 may overlap the center region C103 of the photoelectric conversion device 103 in the first direction (Z direction). In some example embodiments, when the floating diffusion region 113 overlaps with the center region C103 of the photoelectric conversion device 103 in the first direction (Z direction), the central region C113 of the floating diffusion region 113 may not overlap the center region C103 of the photoelectric conversion device 103. Detailed descriptions thereof are provided with reference to FIG. 6.

The transfer gate electrode 111 may extend between the first surface 101S1 and the photoelectric conversion device 103 in the substrate 101 and from the first surface 101S1 in the first direction (Z direction) perpendicular to the first surface 101S1. In this regard, the transfer gate electrode 111 may overlap the photoelectric conversion device 103 in the first direction (Z direction).

The transfer gate electrode 111 may overlap a first portion, or side surface group 113SA which is some portion of a whole perimeter, or whole side surface 113S of the floating diffusion region 113, and may extend along a fourth side S4 of first to fourth sides S1, S2, S3, and S4 of the unit pixel PX1.

The floating diffusion region 113 may have a quadrilateral shape having first to fourth portions, or first to fourth side surfaces 113S1, 113S2, 113S3, and 113S4. The transfer gate electrode 111 may overlap the first side surface 113S1, which is some portion of the floating diffusion region 113. The transfer gate electrode 111 may be close to the floating diffusion region 113. As a voltage is applied to the transfer gate electrode 111, a charge transfer path may be between the center region C103 of the photoelectric conversion device 103 and the floating diffusion region 113 only in the vertical direction.

Although with reference to FIG. 2, the first side surface group 113SA overlapping the transfer gate electrode 111 is described as only including one first side surface 113S1, embodiments are not limited thereto. The first side surface group 113SA may include at least two of the first to fourth side surfaces 113S1, 113S2, 113S3, and 113S4. Although with reference to FIG. 2, the transfer gate electrode 111 is described as being along the fourth side S4, embodiments are not limited thereto.

In some example embodiments, the transfer gate electrode 111 may be along at least two of the first to fourth sides S1, S2, S3, and S4, or may extend to at least one of the first to fourth vertices V1, V2, V3, and V4 that are respectively connected to the first to fourth sides S1, S2, S3, and S4. In other words, the transfer gate electrode 111 may arbitrarily extend around the edge of the unit pixel PX1.

Figure 7:
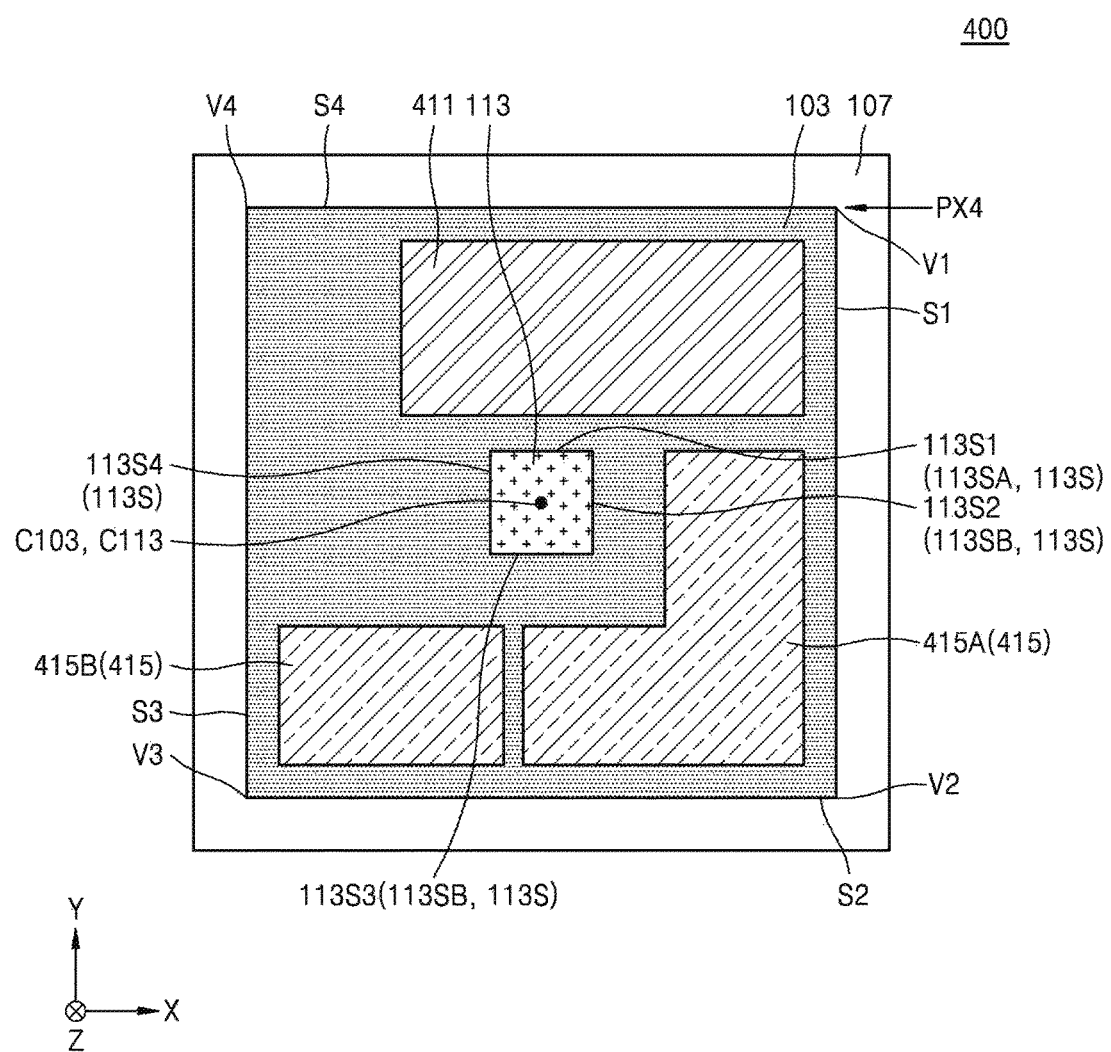
FIG. 7 illustrates a layout showing a unit pixel included in an image sensor according to some example embodiments of inventive concepts.
Figure 8:
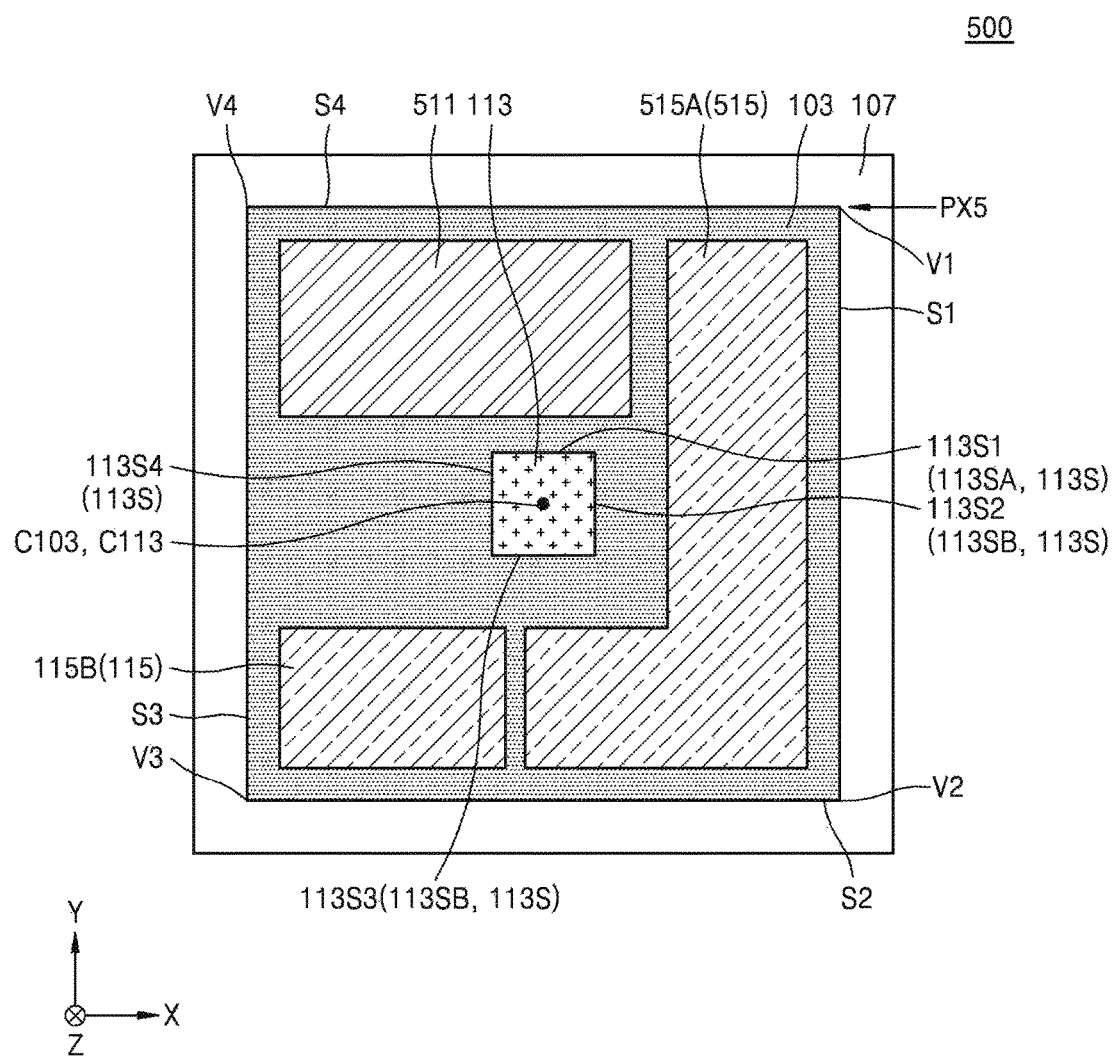
FIG. 8 illustrates a layout showing a unit pixel included in an image sensor according to some example embodiments of inventive concepts.

Referring to FIG. 7, the transfer gate electrode 411 may extend to a region close to a first vertex V1 of first to fourth vertices V1, V2, V3, and V4 which are respectively connected to first to fourth sides S1, S2, S3, and S4. Referring to FIG. 8, the transfer gate electrode 511 may extend to a region close to a fourth vertex V4 of first to fourth vertices V1, V2, V3, and V4 which are respectively connected to first to fourth sides S1, S2, S3, and S4.

In the image sensor 100 according to example embodiments of inventive concepts, the floating diffusion region 113 may be in a center region of the unit pixel PX1 but not in the edge region of the unit pixel PX1 and thus, the transfer gate electrode 111 may extend in the edge region. As a horizontal area of the transfer gate electrode 111 is increased, a forming process of the transfer gate electrode 111 may become easier to perform, thereby helping to secure that the transfer gate electrode 111 has a more uniform profile. Also, charge transfer capacity is improved to prevent image distortion due to a delay in transferring charge.

In some example embodiments, regarding the shortest distance from the first side surface 113S1 of the floating diffusion region 113 to the fourth side S4 of the deep and shallow device isolation layers 105 and 107, the fourth side S4, a width D1 of the transfer gate electrode 111 may be greater than a distance D2 from the transfer gate electrode 111 to the deep and shallow device isolation layers 105 and 107. Thus, an effect of extending a horizontal area of the transfer gate electrode 111 may be increased (e.g. maximized).

By also referring to FIG. 4, a first length 111L1 of the transfer gate electrode 111 in the substrate 101 in the first direction (Z direction) may be longer than a second length 111L2 of the transfer gate electrode 111 in a second direction (X direction) perpendicular to the first direction (Z direction) or a third length 111L3 thereof in a third direction (Y direction). However, embodiments are not limited thereto. One of the second and third lengths 111L2 and 111L3 may be longer than the first length 111L1.

In general, a transfer gate electrode may be parallel to a light-receiving surface direction (X direction and Y direction) of a photoelectric conversion device. In this case, securing a light-receiving area of the photoelectric conversion device may be difficult.

However, the transfer gate electrode 111 according to example embodiments of inventive concepts may extend in a first direction (Z direction) perpendicular to a light-receiving surface direction (X direction and Y direction) of the photoelectric conversion device 103 and thus, the transfer gate electrode 111 may not have any area in the light-receiving surface direction (X direction and Y direction) of the photoelectric conversion device 103. As a result, the photoelectric conversion device 103 may have a sufficient area for receiving light.

An outer surface of the transfer gate electrode 111 may be covered by a gate dielectric layer 109. The gate dielectric layer 109 may insulate the transfer gate electrode 111 from the substrate 101 so that a voltage may not be directly applied to the substrate 101. When a voltage is applied to the transfer gate electrode 111, a channel region may be formed close to the gate dielectric layer 109.

The set of transistors 115 may include at least one of a source follower transistor, a reset transistor, and a selection transistor.

The set of transistors 115 may be between the first surface 101S1 and the photoelectric conversion device 103 in the substrate 101. The set of transistors 115 may overlap a second side surface group 113SB of which at least some portions are different from a first side surface group 113SA of a whole side surface 113S of the floating diffusion region 113, and the set of transistors 115 may extend along the first side S1 and the second side S2 of the first to fourth sides S1, S2, S3, and S4 of the unit pixel PX1. Accordingly, the set of transistors 115 may extend to areas close to the first vertex V1, the second vertex V2, and the third vertex V3 of the first to fourth vertices V1, V2, V3, and V4 that are respectively connected to the first to fourth sides S1, S2, S3, and S4.

The image sensor 100 according to example embodiments of inventive concepts may have the floating diffusion region 113 in a center region of the unit pixel PX1 to secure an edge region of the unit pixel PX1 where the set of transistors 115 extends. As a horizontal area of the set of transistors 115 increases, a forming process of the set of transistors 115 may become easier to perform, thereby reducing noise of a sensed image and improving image quality.

In some example embodiments, regarding a shortest distance from the second side surface 113S2 of the floating diffusion region 113 to the first side S1 of the deep and shallow device isolation layers 105 and 107, a width D3 of the set of transistors 115 may be greater than a distance D4 from the second side surface 113S2 of the floating diffusion region 113 to the set of transistors 115.

In this regard, an effect of extending a horizontal area of the set of transistors 115 may be increased (e.g. maximized).

Each of, or at least some of, the transfer gate electrode 111, the floating diffusion region 113, and the set of transistors 115 may be electrically separated by the deep and shallow device isolation layers 105 and 107.

An insulation layer 123 may be on the second surface 101S2 of the substrate 101. The insulation layer 123 may include silicon oxide (SiOx), silicon oxynitride (SiOxNy), silicon nitride (SiNx), germanium oxynitride (GeOxNy), germanium silicon oxide (GeSixOy) or a material having a high dielectric rate.

A color filter layer 125 may be inside the insulation layer 123. Of incident light, light having a specific wavelength band may pass through the color filter layer 125. For example, only one of green, red, and blue light may pass through the color filter layer 125. The photoelectric conversion device 103 in a lower portion of the color filter layer 125 may detect light that has the specific wavelength band and passes through the color filter layer 125 to generate an electric signal.

A micro lens 127 may be on the insulation layer 123 and the color filter layer 125. The micro lens 127 may adjust a path for light incident onto the unit pixel PX1 to concentrate in the photoelectric conversion device 103.

The pixel circuit layer 117 may be on the first surface 101S1 of the substrate 101. The pixel circuit layer 117 may include a contact 121 and a wire 119 connected to the contact 121, the contact 121 being electrically connected to each of the transfer gate electrode 111 that may control the photoelectric conversion device 103, the floating diffusion region 113, and the set of transistors 115.

Figure 5:
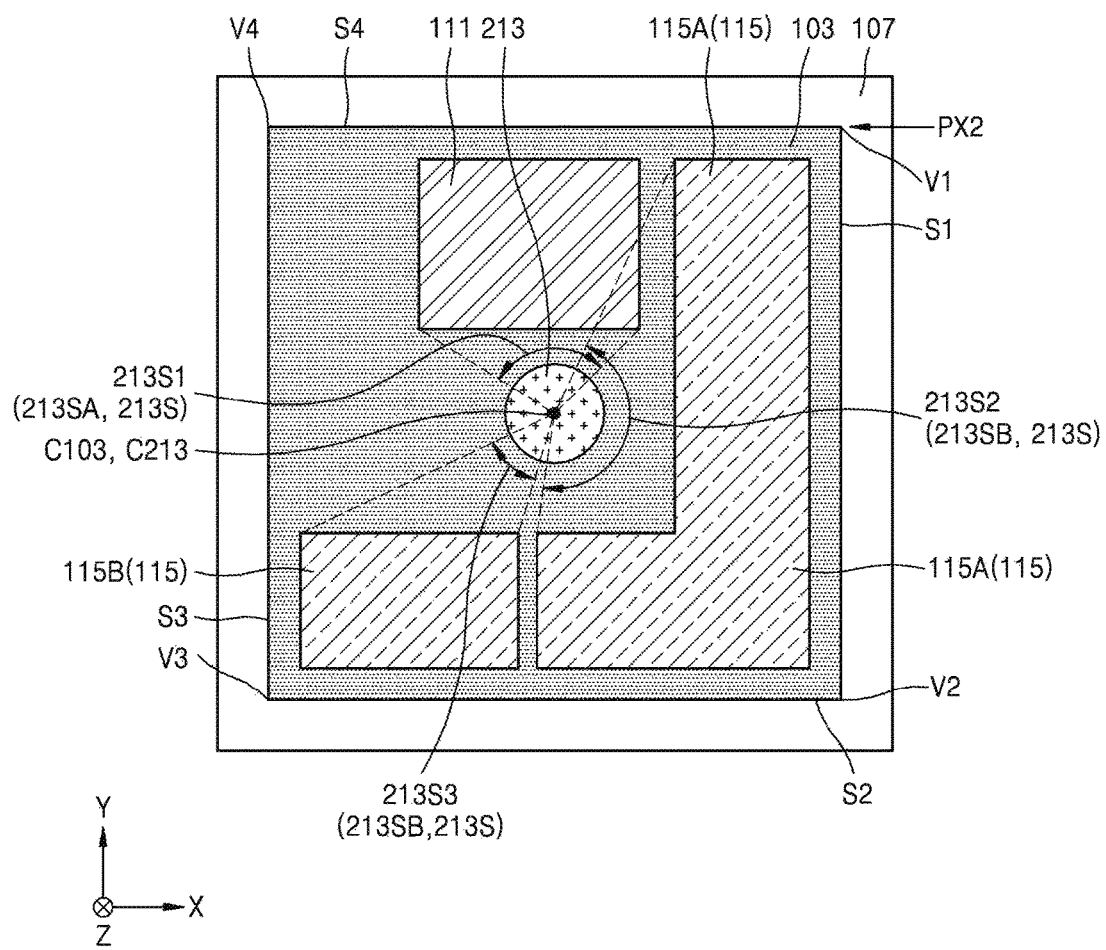
FIG. 5 illustrates a layout diagram showing a unit pixel included in an image sensor according to some example embodiments of inventive concepts.

FIG. 5 illustrates a layout diagram showing a unit pixel PX2 included in an image sensor 200 according to example embodiments of inventive concepts. The image sensor 200 is substantially the same as the image sensor 100 of FIGS. 2 to 4, except for a shape of a floating diffusion region 213.

Referring to FIG. 5, the image sensor 200 may include a substrate 101, a photoelectric conversion device 103 in the substrate 101, the floating diffusion region 213 overlapping with a center region C103 of the photoelectric conversion device 103 and having a circle shape, a transfer gate electrode 111 overlapping with some portions of the floating diffusion region 213, and a set of transistors 115 overlapping with other portions of the floating diffusion region 213. The substrate 101 may include the unit pixel PX2 having a quadrilateral shape having first to fourth vertices V1, V2, V3, and V4 and first to fourth sides S1, S2, S3, and S4 defined by deep and shallow device isolation layers 105 and 107.

The floating diffusion region 213 may have a circular cross-section in the substrate 101. The floating diffusion region 213 may be by an impurity implantation process and thus may have various other shapes.

The floating diffusion region 213 may contact, in the substrate 101, the first surface 101S1 and overlap the center region C103 of the photoelectric conversion device 103 in a first direction (Z direction) perpendicular to the first surface 101S1. Thus, as described above, a horizontal charge transfer path from the photoelectric conversion device 103 to the floating diffusion region 213 may be removed and a vertical path may be increased (e.g. maximized). As a result, a whole charge transfer path is reduced thereby improving charge transfer efficiency and reducing (e.g. preventing) image distortion.

The transfer gate electrode 111 may overlap a first side surface group 213SA, which refers some portions of a whole side surface 213S of the floating diffusion region 213. Here, the first side surface group 213SA may be equal to or more than a quarter of the whole side surface 213S of the floating diffusion region 213.

The image sensor 200 according to example embodiments of inventive concepts may have the floating diffusion region 213 in a center region of the unit pixel PX2 to secure an edge region of the unit pixel PX2 and to extend the transfer gate electrode 111 in the edge region. As a horizontal area of the transfer gate electrode 111 increases, a forming process of the transfer gate electrode 111 may become easier to perform thereby helping to secure that the transfer gate electrode 111 has a more uniform profile. Also, charge transfer capacity is improved and thus image distortion due to a delay in transferring charge is reduced (e.g. prevented).

The set of transistors 115 may overlap a second side surface group 213SB of which at least some portions may be different from the first side surface group 213SA of the whole side surface 213S of the floating diffusion region 213. Accordingly, the second side surface group 213SB may be equal to or more than a half of the whole side surface 213S of the floating diffusion region 213. For example, a surface equal to or more than a half of the whole side surface 213S of the floating diffusion region 213 may be covered by the set of transistors 115.

The set of transistors 115 may include first and second transistors 115A and 115B. The first transistor 115A may overlap a 2-1 side surface 213S2 of the whole side surface 213S of the floating diffusion region 213, and the second transistor 115B may overlap a 2-2 side surface 213S3 of the whole side surface 213S of the floating diffusion region 213. Here, the first transistor 115A may overlap a quarter or more of the whole side surface 213S of the floating diffusion region 213. In some example embodiments, the first transistor 115A may be or may include a source follower transistor. As an area of the source follower transistor increases, noise of an image may be more effectively reduced.

As described above, the image sensor 200 according to example embodiments of inventive concepts may have the floating diffusion region 213 in a center region of the unit pixel PX2 to secure an edge region of the unit pixel PX2 and extend the set of transistors 115 in the edge region of the unit pixel PX2. As a horizontal area of the set of transistors 115 increases, a forming process of the set of transistors 115 may become easier to perform thereby reducing noise of a sensed image and improving image quality.

Figure 6:
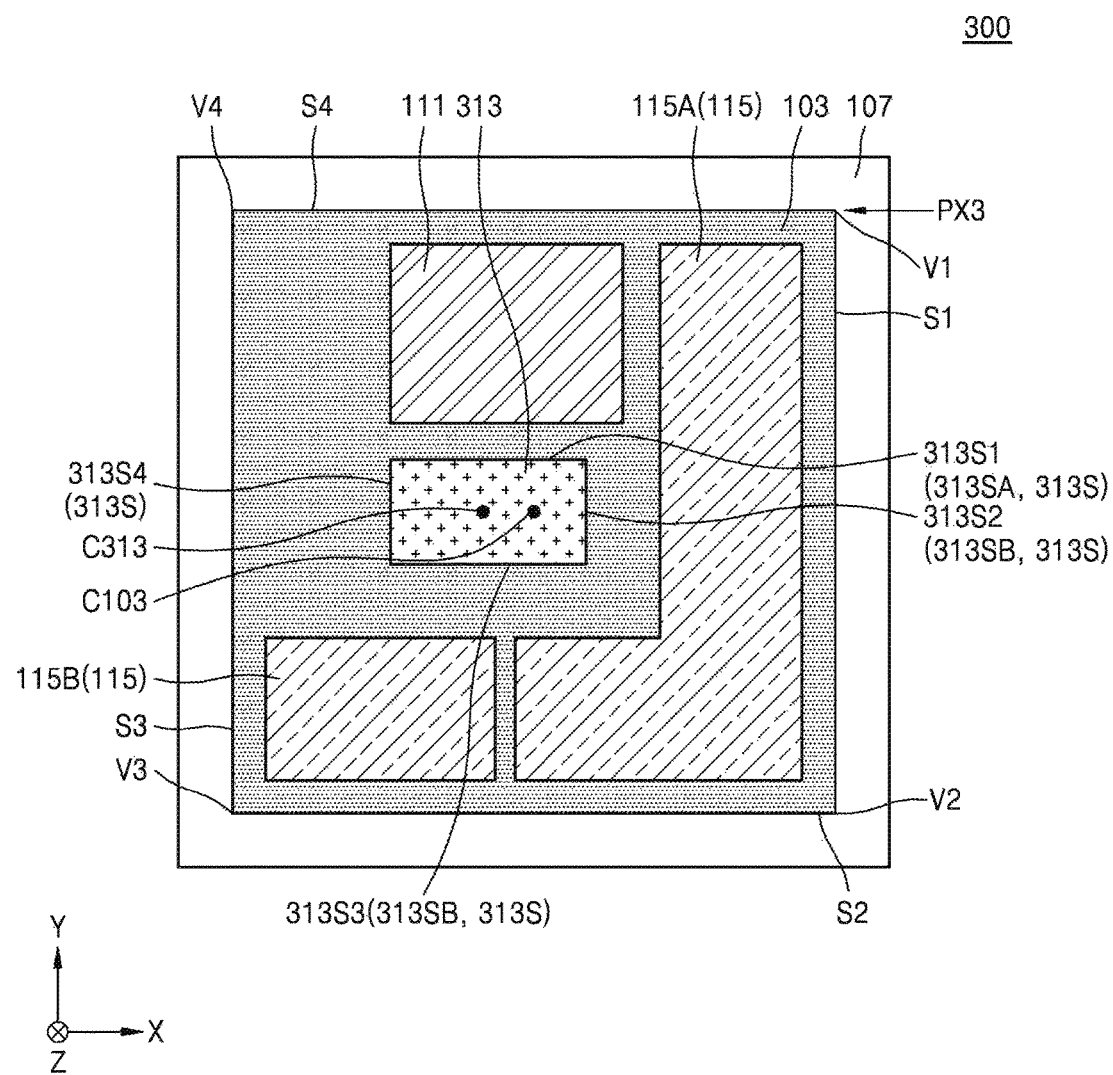
FIG. 6 illustrates a layout showing a unit pixel included in an image sensor according to some example embodiments of inventive concepts.

FIG. 6 illustrates a layout showing a unit pixel PX3 included in an image sensor 300 according to example embodiments of inventive concepts. The image sensor 300 is substantially the same as the image sensor 100 of FIGS. 2 to 4, except for a shape and a location of a floating diffusion region 313.

Referring to FIG. 6, the image sensor 300 may include a substrate 101, a photoelectric conversion device 103 in the substrate 101, the floating diffusion region 313 overlapping a center region C103 of the photoelectric conversion device 103, a transfer gate electrode 111 overlapping some portions of the floating diffusion region 313, and a set of transistors 115 overlapping other portions of the floating diffusion region 313.

Each of the floating diffusion regions 113 of FIGS. 2 to 4 and the floating diffusion region 113 of FIG. 5 is described as that the center region C113 thereof overlaps with the center region C103 of the photoelectric conversion device 103. However, in the image sensor 300, a central region C313 of the floating diffusion region 313 may not overlap the center region C103 of the photoelectric conversion device 103 in a first direction (Z direction).

Even in this case, a region where a maximum voltage is generated in the photoelectric conversion device 103 is the center region C103 of the photoelectric conversion device 103, and thus a channel region defined by the transfer gate electrode 111 may be along a surface of the transfer gate electrode 111 in a direction perpendicular to the central region C103 of the photoelectric conversion device 103.

Thus, even when the central region C313 of the floating diffusion region 313 does not overlap the center region C103 of the photoelectric conversion device 103, if the floating diffusion region 313 is aligned with the center region C103 of the photoelectric conversion device 103, a horizontal charge transfer path from the photoelectric conversion device 103 to the floating diffusion region 313 may be reduced (e.g. removed). As a result, a charge transfer path may be reduced thereby improving charge transfer efficiency and reducing (e.g. preventing) image distortion.

FIG. 7 illustrates a layout showing a unit pixel PX4 included in an image sensor 400 according to example embodiments of inventive concepts. The image sensor 400 is substantially the same as the image sensor 100 of FIGS. 2 to 4, except for shapes and locations of a transfer gate electrode 411 and a set of transistors 415.

Referring to FIG. 7, the image sensor 400 may include a substrate 101, a photoelectric conversion device 103 included in the substrate 101, a floating diffusion region 113 overlapping a center region C103 of the photoelectric conversion device 103, the transfer gate electrode 411 overlapping some portions of the floating diffusion region 113, and the set of transistors 415 overlapping other portions of the floating diffusion region 113. The substrate 101 may include the unit pixel PX4 having a quadrilateral shape having first to fourth vertices V1, V2, V3, and V4 and first to fourth sides S1, S2, S3, and S4 defined by deep and shallow device isolation layers 105 and 107.

One of the transfer gate electrode 411 and the set of transistors 415 may be in a region secured by having the floating diffusion region 113 in a center region of the unit pixel PX4.

In the image sensor 400, the transfer gate electrode 411 may be along the fourth side S4 and extend to a region close to the first vertex V1. As described above, the image sensor 400 according to example embodiments may include the transfer gate electrode 411 extended to an edge area of the unit pixel PX4. As a horizontal area of the transfer gate electrode 411 increases, a forming process of the transfer gate electrode 411 may become easier to perform thereby helping to secure that the transfer gate electrode 411 has a more uniform profile. Also, charge transfer capacity is improved and thus image distortion due to a delay in transferring charge is reduced (e.g. prevented).

The set of transistors 415 may be along the first side S1 and the second side S2 and extend to the second vertex V2 and the third vertex V3. Thus, noise of a sensed image may be reduced and image quality may be improved.

FIG. 8 illustrates a layout showing a unit pixel PX5 included in an image sensor 500 according to example embodiments of inventive concepts. The image sensor 500 is substantially the same as the image sensor 100 of FIGS. 2 to 4, except for shapes and locations of a transfer gate electrode 511 and a set of transistors 515.

Referring to FIG. 8, the image sensor 500 may include a substrate 101, a photoelectric conversion device 103 included in the substrate 101, a floating diffusion region 113 overlapping a center region C103 of the photoelectric conversion device 103, the transfer gate electrode 511 overlapping some portions of the floating diffusion region 113, and the set of transistors 515 overlapping other portions of the floating diffusion region 113.

One of the transfer gate electrode 511 and the set of transistors 515 may be in a region secured by having the floating diffusion region 113 in a center region of the unit pixel PX5.

In the image sensor 500, the transfer gate electrode 511 may be along a fourth side S4 and extend to a region close to a fourth vertex V4. As described above, the image sensor 500 according to example embodiments of inventive concepts may have the transfer gate electrode 511 extended in an edge region of the unit pixel PX5, thereby helping to secure that the transfer gate electrode 511 has a more uniform profile. In addition, charge transfer capacity may be improved and thus image distortion due to a delay in transferring charge may be reduced (e.g. prevented).

The set of transistors 515 may be along a first side S1 and a second side S2 and extend to a first vertex V1, a second vertex V2 and a third vertex V3 thereby reducing noise of a sensed image and improving image quality.

FIGS. 9A to 9G are cross-sectional views showing a forming process of a unit pixel described in FIG. 2., taken along a line A-A of FIG. 2.

Figure 9A:
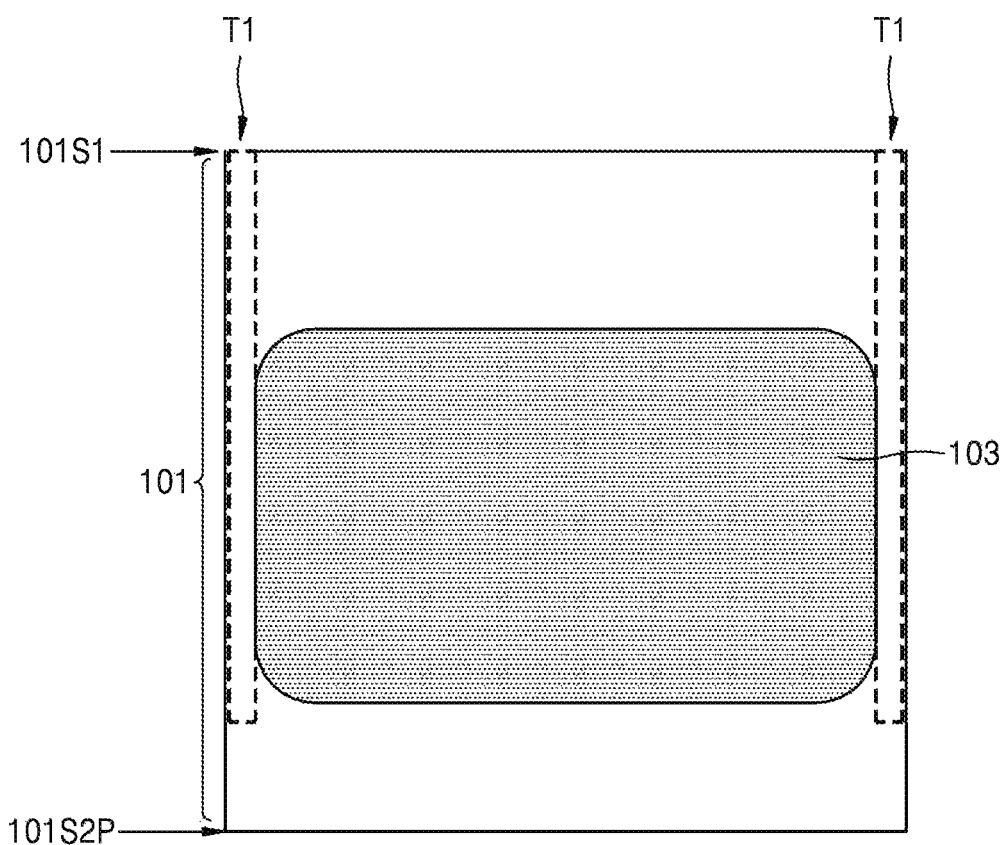
FIGS. 9A to 9G are cross-sectional views showing a forming process of a unit pixel described in FIG. 2., taken along line A-A of FIG. 2.

Referring to FIG. 9A, a substrate 101 may include a first surface 101S1 and a preliminary second surface 101S2P. The substrate 101 may be doped with a P-type impurity, but embodiments are not limited thereto. A photoelectric conversion device 103 and a well region (not shown) may be formed in the substrate 101 by performing an ion implantation process. The photoelectric conversion device 103 may be formed by doping an N-type impurity. The photoelectric conversion device 103 may be formed after forming deep and shallow device isolation layers 105 and 107.

Then, a mask pattern (not shown) defining a unit pixel may be formed on the first surface (101S1). The mask pattern may be used as an etch mask for etching the substrate 101 close to the first surface 101S1 to form a first trench T1. The first trench T1 may be for forming a deep device isolation layer.

Figure 9B:
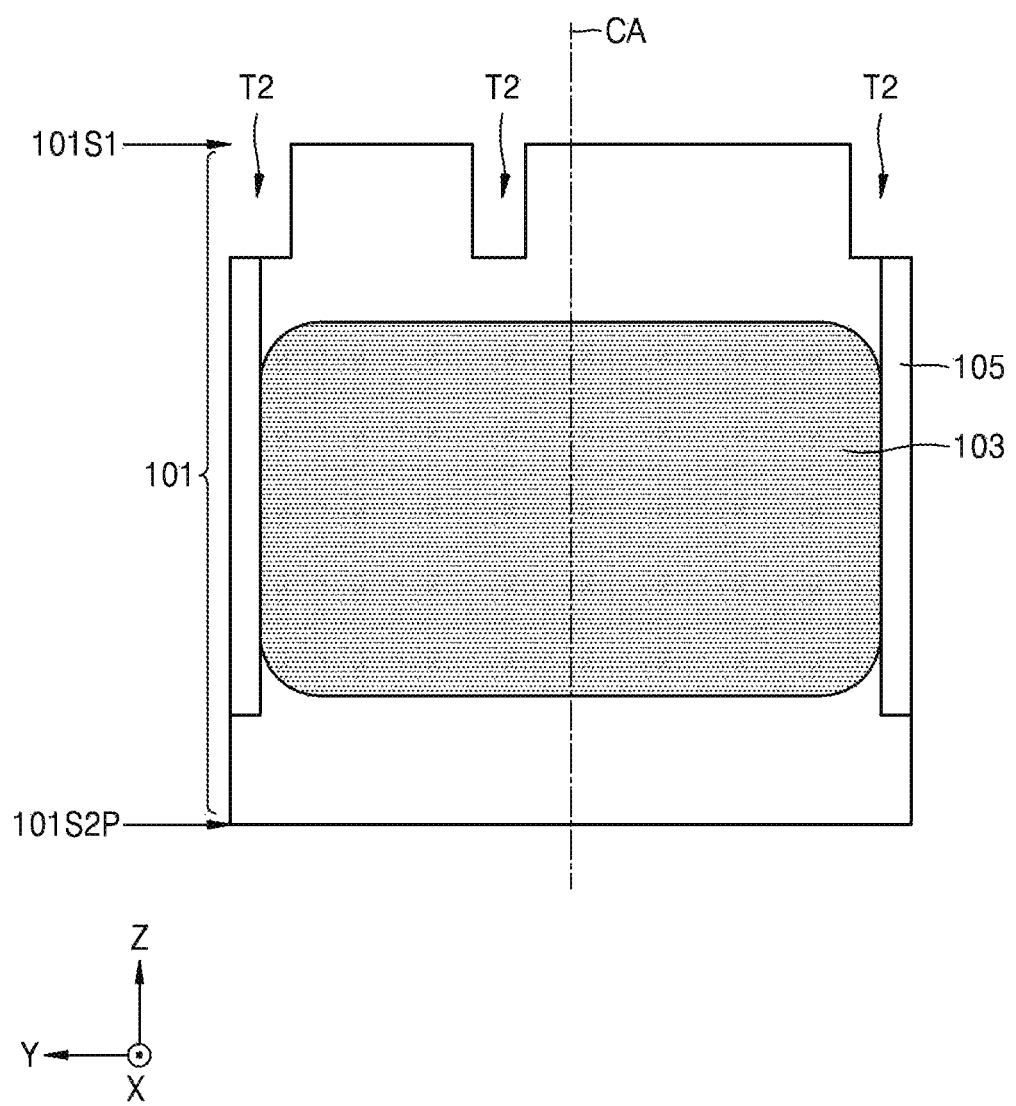

Referring to FIG. 9B, an insulation layer for filling the first trench T1 may be formed and a planarization etch process may be performed on the insulation layer to form a deep device isolation layer 105. Then, a mask pattern (not shown) may be formed on the first surface 101S1, and the mask pattern may be used as an etch mask for etching the substrate 101 close to the first surface 101S1 to form a second trench T2. The second trench T2 may be for forming a shallow device isolation layer.

Since a floating diffusion region described later may be formed in a center region of the photoelectric conversion device 103, the second trench T2 may be formed in a region which is not the center region of the photoelectric conversion device 103.

Figure 9C:
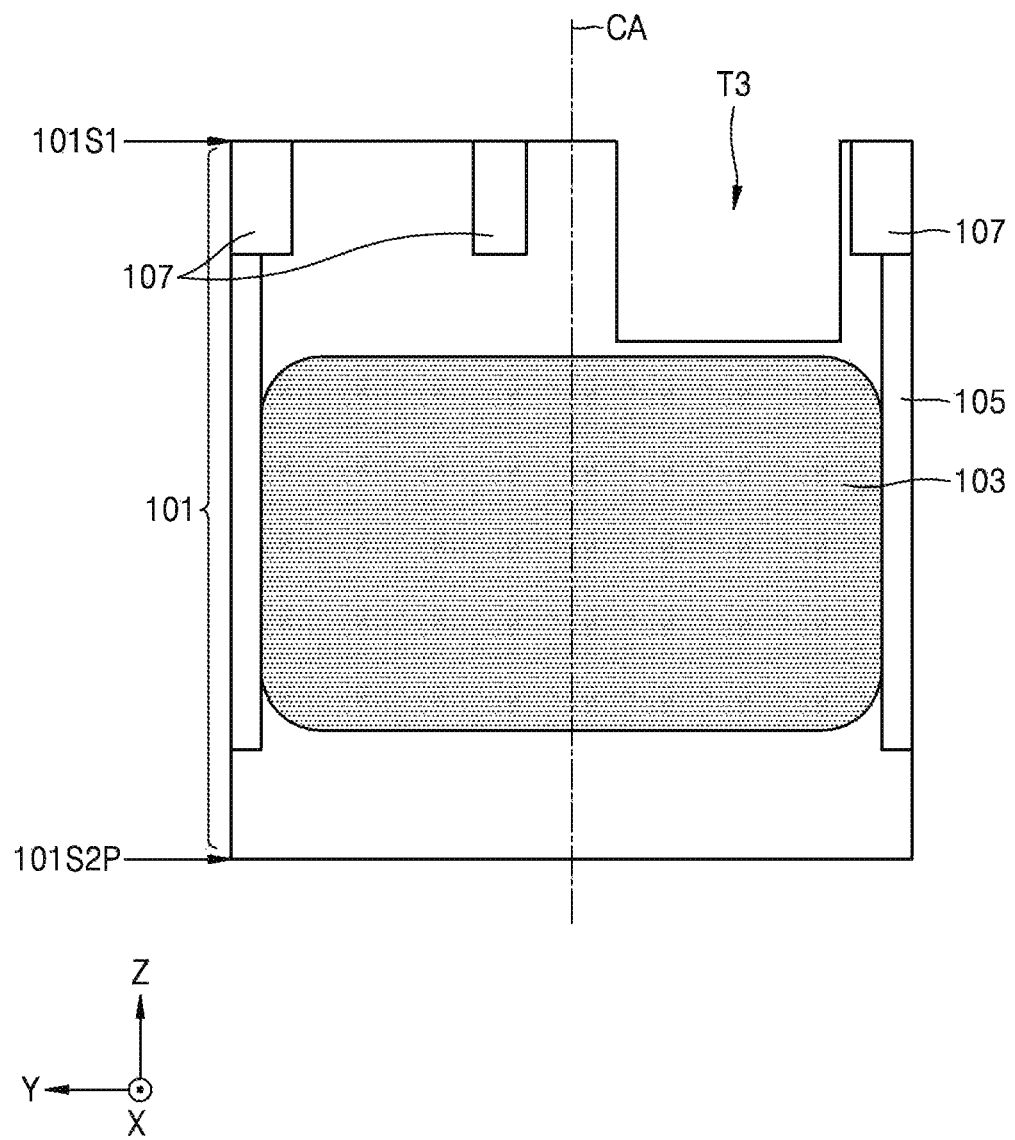

Referring to FIG. 9C, an insulation layer for filling the second trench T2 may be formed and a planarization and/or etch process may be performed on the insulation layer to form a shallow device isolation layer 107.

Then, between shallow device isolation layers 107 of the first surface 101S1, a third trench T3 in which a transfer gate electrode is formed may be formed. As described above, the third trench T3 may extend to an edge region.

Figure 9D:
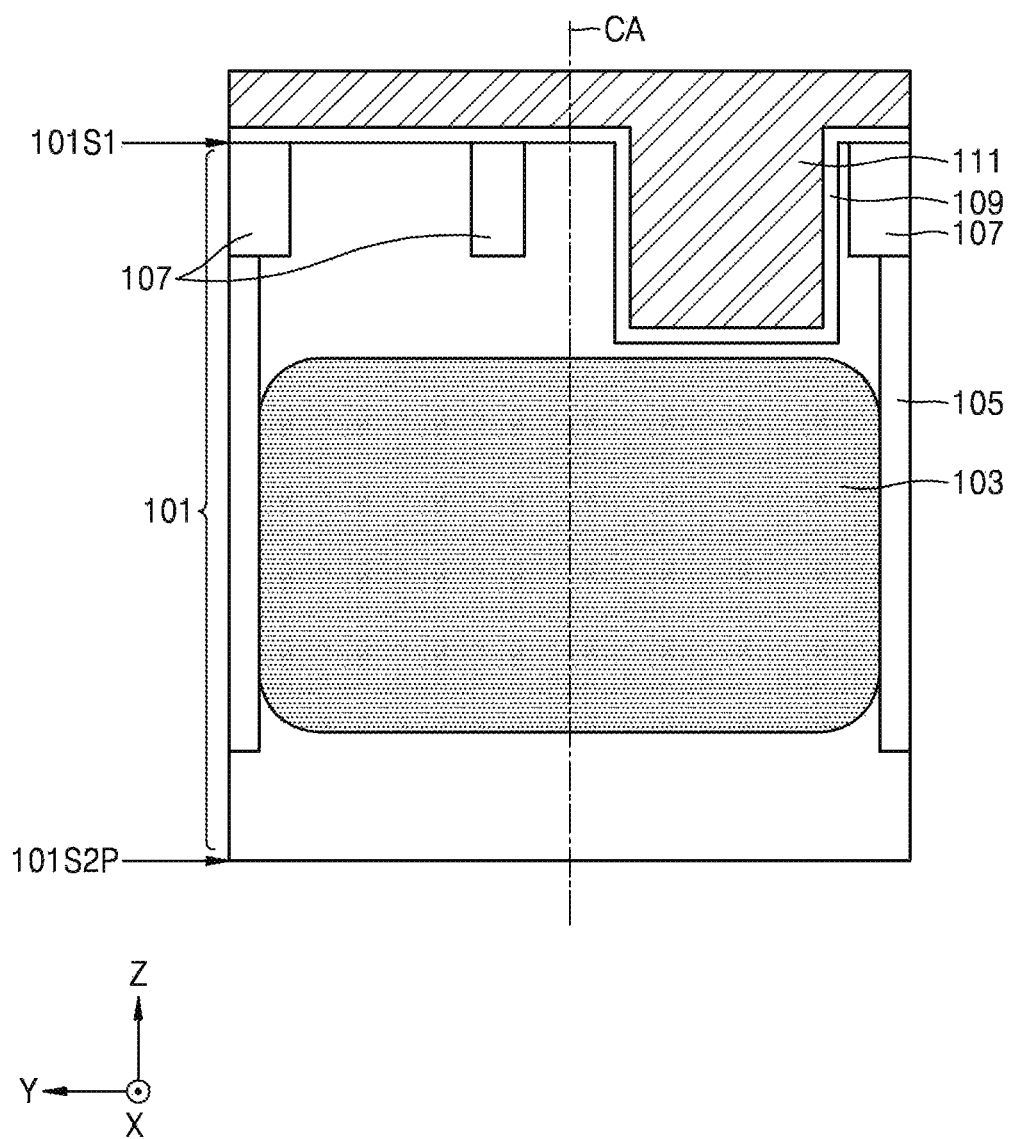

Referring to FIG. 9D, a gate dielectric layer 109 and a transfer gate electrode material 111P may cover a side wall and a bottom of the third trench T3.

Figure 9E:
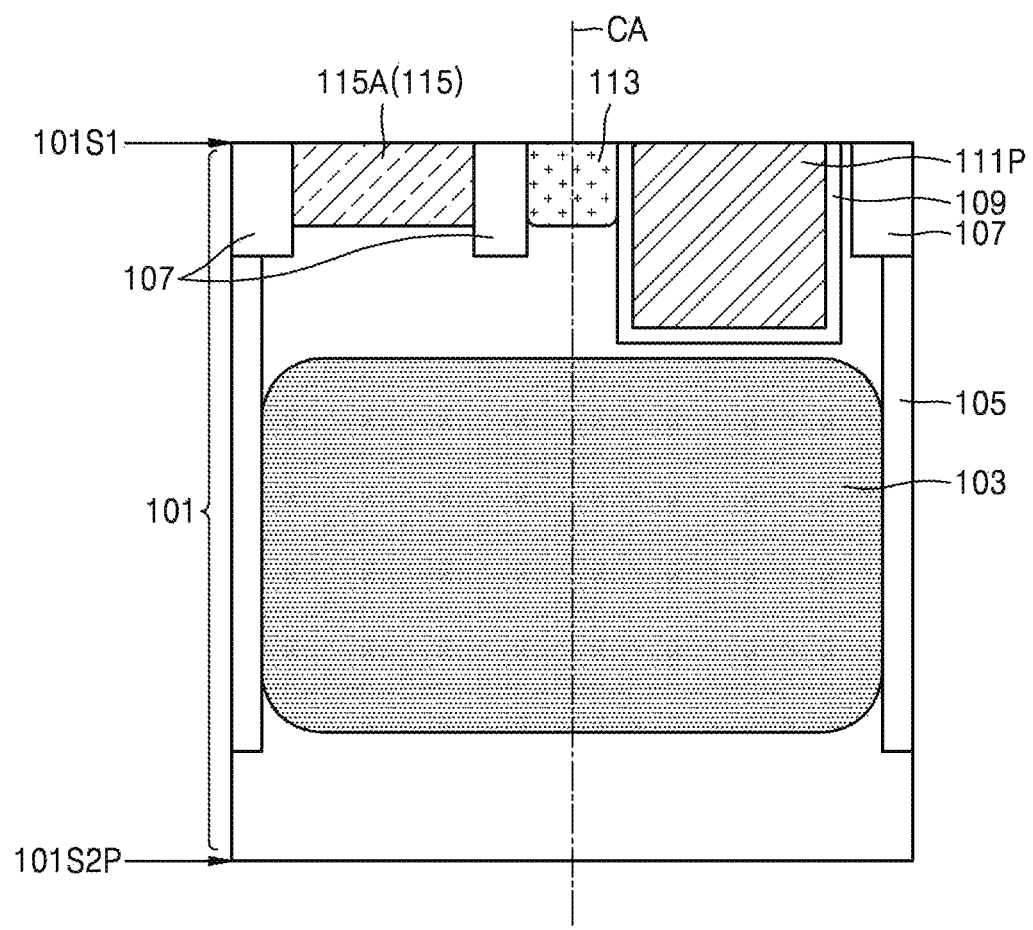

Referring to FIG. 9E, the gate dielectric layer 109 and the transfer gate electrode material 111P may be etched to form a transfer gate electrode 111. Next, an ion implantation process may be performed to form a floating diffusion region 113 and a set of transistors 115 in a region close to the transfer gate electrode 111.

Figure 9F:
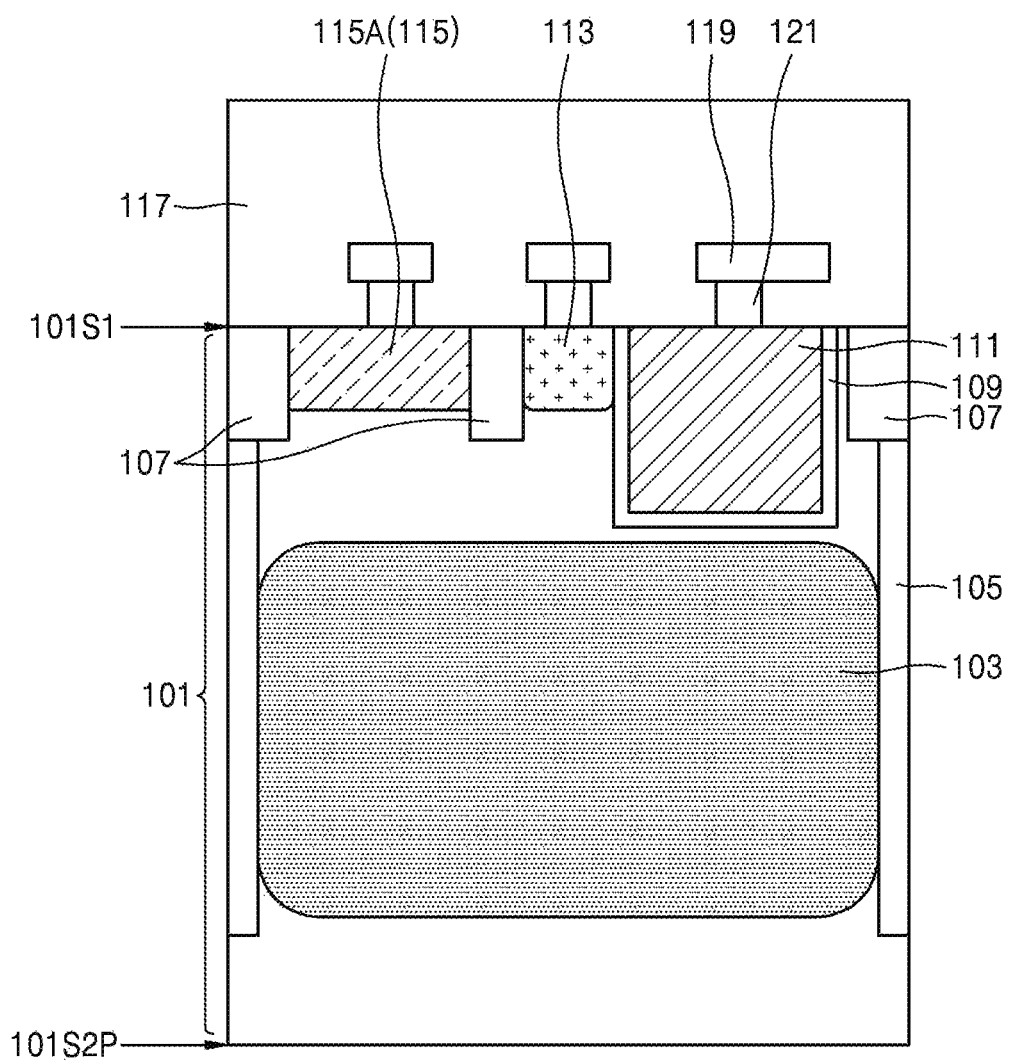

Referring to FIG. 9F, a pixel circuit layer 117 may be formed on the first surface 101S 1, the pixel circuit layer 117 including a contact 121 and a wire 119.

Figure 9G:
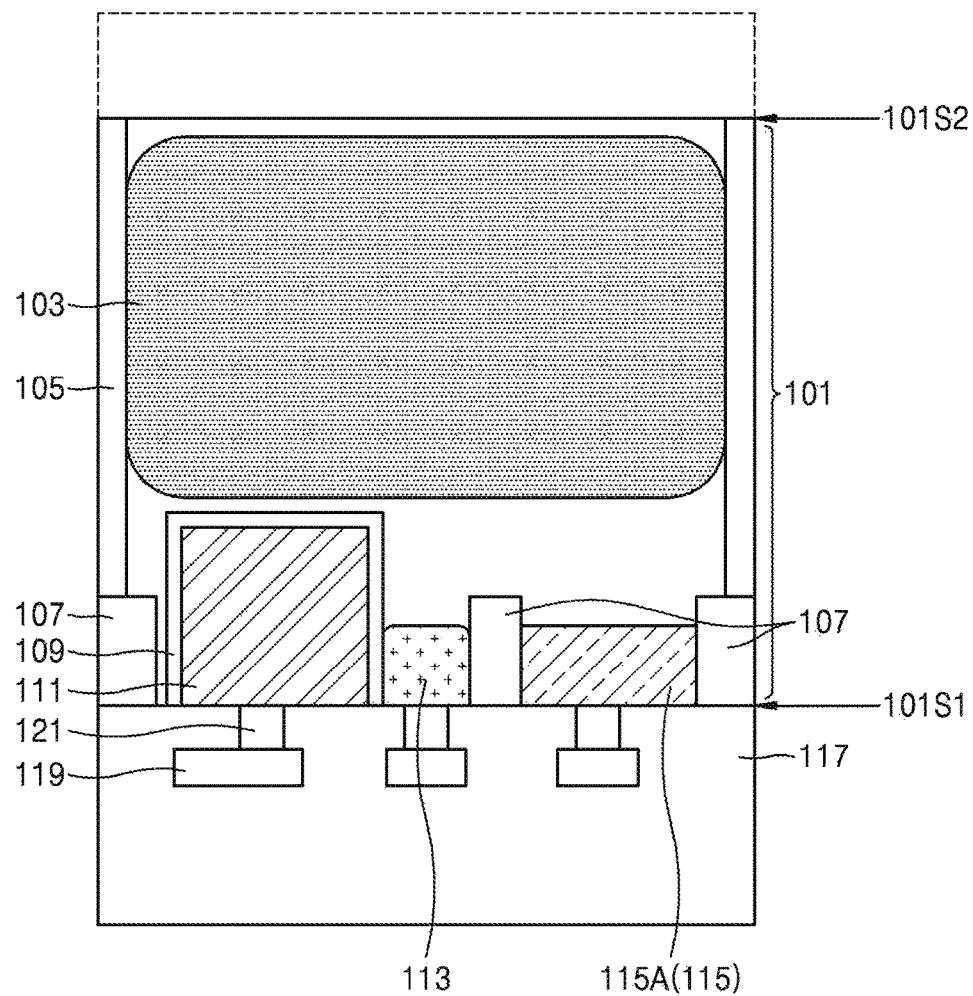

Referring to FIG. 9G, the preliminary second surface 101S2P faces upward by turning the substrate 101 upside down. Next, a grinding or a chemical-mechanical polishing (CMP) process may be performed to remove a region of the substrate 101 close to the preliminary second surface 101S2P by a desired (or, alternatively, predetermined) thickness so as to expose the second surface 101S2 of FIG. 3. Next, as shown in FIG. 3, the insulation layer 123, the color filter layer 125, and the micro lens 127 may be formed on the second surface 101S2 to produce the image sensor 100.

FIGS. 9A to 9G show a method of producing the image sensor 100 of FIGS. 2 to 4, but the method may also apply to the image sensors 200, 300, 400, and 500 of FIGS. 5 to 8.

Figure 10:
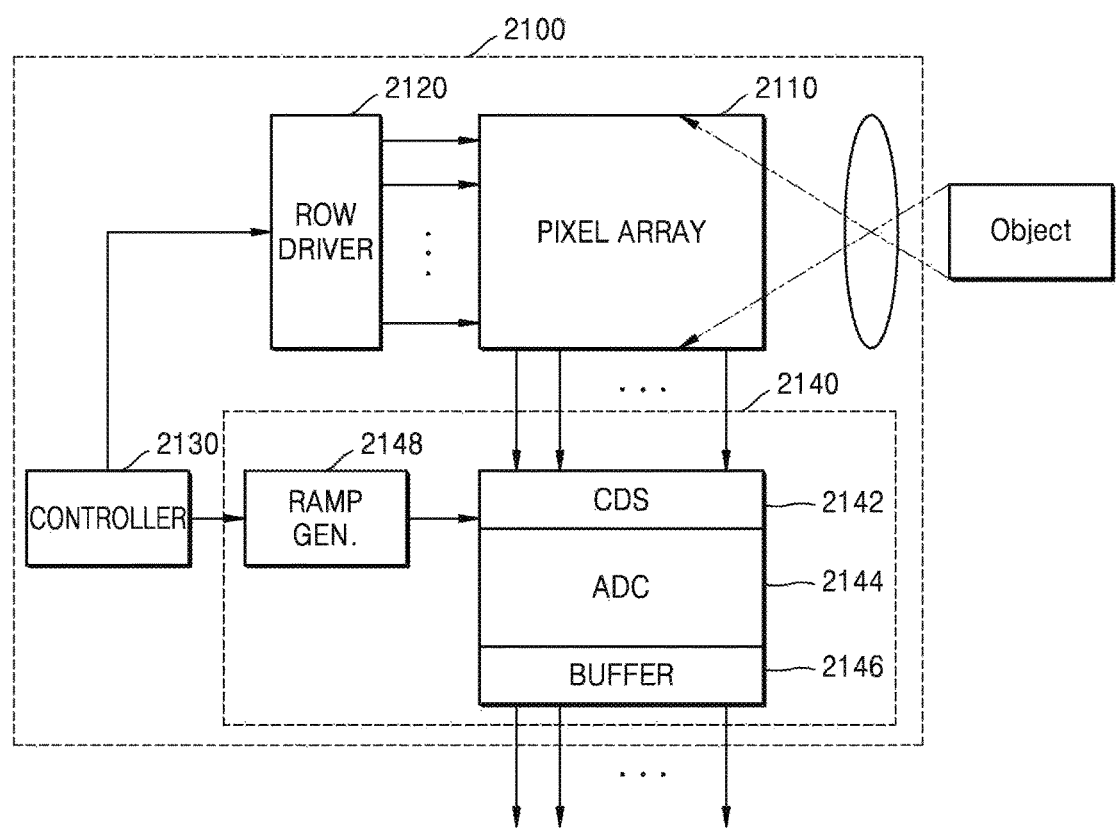
FIG. 10 illustrates a block diagram showing an image sensor according to some example embodiments of inventive concepts.

FIG. 10 illustrates a block diagram showing an image sensor 2100 according to example embodiments of inventive concepts.

Referring to FIG. 10, the image sensor 2100 may include a pixel array 2110, a controller 2130, a row driver 2120, and a pixel signal processor 2140. The pixel array 2110 may include the image sensors 100, 200, 300, 400, and 500 according to example embodiments, described in FIGS. 2 to 8.

The pixel array 2110 may include a plurality of unit pixels arranged in a two-dimensional way and each of the unit pixels may include a photosensitive device. The photosensitive device may absorb light to generate charge and an electric signal by the generated charge may be transferred to the pixel signal processor 2140 via a vertical signal path. The unit pixels included in the pixel array 2110 may provide an output voltage one-by-one in row units, and thus unit pixels included in one row of the pixel array 2110 may be activated at the same time by a selection signal output by the row driver 2120. Unit pixels included in a selected row may provide an output voltage according to an amount of absorbed light to an output line of a corresponding column.

The controller 2130 may control the row driver 2120 so that the pixel array 2110 may absorb light to accumulate charge, temporally store the accumulated charge, and externally output an electric signal by the stored charge to outside of the pixel array 2110. Also, the controller 2130 may control the pixel signal processor 2140 so as to measure an output voltage generated by the pixel array 2110.

The pixel signal processor 2140 may include a correlated double sampler (CDS) 2142, an Analog-to-Digital Converter (ADC) 2144 and a buffer 2146. The CDS 2142 may sample and hold an output voltage generated by the pixel array 2110. The CDS 2142 may double-sample a specific noise level and a level according to the generated output voltage to output a level corresponding to a difference. Also, the CDS 2142 may receive a ramp signal generated by a ramp signal generator 2148 and compare the generated output voltage with the ramp signal to output a result thereof.

The ADC 2144 may convert an analog signal corresponding to a level received from the CDS 2142 into a digital signal. The buffer 2146 may latch a digital signal, and the latched signal may be sequentially output to outside of the image sensor 2100 and delivered to an image processor (not shown).

While inventive concepts has been particularly shown and described with reference to example embodiments thereof, it will be understood by those of ordinary skill in the art that various changes in form and details may be made therein without departing from the spirit and scope as defined by the following claims.

What is claimed is:

1. An image sensor, comprising:
    a substrate comprising a first surface, a second surface opposite to the first surface, and a unit pixel having at least four sides;
    a photoelectric conversion device in the unit pixel;
    a floating diffusion region contacting the first surface in the unit pixel, a portion of the floating diffusion region over a center of the photoelectric conversion device when viewed in a plan view above the first surface, the floating diffusion region overlapping the center in a first direction perpendicular to the first surface;
    a gate electrode in the unit pixel, overlapping, in a second direction parallel to the first surface and perpendicular to the first direction, with some portions of the floating diffusion region, the gate electrode being along a first set of sides, the first set of sides including at least one side of the at least four sides; and
    a set of transistors in the unit pixel, overlapping, in the second direction, with some portions of the floating diffusion region,
    wherein, when viewed from the plan view, the set of transistors are along a second set of sides that comprises at least two sides of the at least four sides, the first set of sides and the second set of sides not having a common side.

2. The image sensor of claim 1, wherein
    the set of transistors is in regions close to at least two vertices of four vertices that are respectively connected to the at least four sides, and
    the gate electrode and the set of transistors are in regions close to at least three vertices of the four vertices.

3. The image sensor of claim 2, wherein
    the set of transistors is along two sides of the at least four sides and in regions close to three vertices of the four vertices.

4. The image sensor of claim 3, wherein the gate electrode is along one side of the at least four sides and in a region close to one vertex of the four vertices.

5. The image sensor of claim 2, wherein
    the set of transistors is along two sides of the at least four sides and in regions close to two vertices, and
    the gate electrode is along one side and in a region close to at least one vertex of the four vertices.

6. The image sensor of claim 1, further comprising:
    a device isolation layer defining the unit pixel, a width of the gate electrode being greater than a distance from the gate electrode to an inner surface of the device isolation layer.

7. The image sensor of claim 1 further comprising:
    a device isolation layer defining the unit pixel, a width of the set of transistors being greater than a distance from a side surface of the floating diffusion region to the set of transistors.

8. The image sensor of claim 1, wherein a center of the floating diffusion region overlaps with a center of the photoelectric conversion device in the first direction.

9. The image sensor of claim 1, wherein the floating diffusion region overlaps with a center region of the photoelectric conversion device in the first direction, and a center region of the floating diffusion region does not overlap the center region of the photoelectric conversion device.

10. The image sensor of claim 1, wherein
    the gate electrode extends from the first surface in the first direction, and
    a length of the gate electrode in the first direction is greater than a length of the gate electrode in the second direction perpendicular to the first direction and parallel to the first surface.

11. The image sensor of claim 1, wherein the gate electrode overlaps with the photoelectric conversion device in the first direction.

12. An image sensor, comprising:
    a substrate comprising a first surface and a second surface opposite to the first surface;
    a photoelectric conversion device in the substrate;
    a floating diffusion region in the substrate contacting the first surface, a portion of the floating diffusion region over a center of the photoelectric conversion device when viewed from a plan view above the first surface, the floating diffusion region overlapping the center in a first direction perpendicular to the first surface;
    a gate electrode in the substrate, a side of the gate electrode overlapping with a first portion that is some portions of a whole perimeter of the floating diffusion region when viewed from the plan view; and
    a set of transistors in the substrate, overlapping, in a second direction parallel to the first surface and perpendicular to the first direction, with a second portion that is some portions of the whole perimeter of the floating diffusion region and different from the first portion in at least some portions of the whole perimeter,
    wherein, when viewed from the plan view, the first portion and the second portion are greater than or equal to a half of the whole perimeter of the floating diffusion region.

13. The image sensor of claim 12, wherein
    the second portion is greater than or equal to a half of the whole perimeter of the floating diffusion region.

14. The image sensor of claim 12, wherein
    the set of transistors comprises a source follower transistor and a selection transistor, and
    a side surface of the whole perimeter of the floating diffusion region that overlaps with the source follower transistor is greater than or equal to a quarter of the whole perimeter.

15. The image sensor of claim 12, wherein the first portion is greater than or equal to a quarter of the whole perimeter of the floating diffusion region.

16. An image sensor comprising:
    a substrate including a first surface and a second surface, the substrate including at least one unit pixel;
    a photoelectric conversion device in the unit pixel and adjacent to the first surface;
    a floating diffusion region at least partially in a center of the unit pixel when viewed from a plan view parallel to the second surface, the floating diffusion region connected to the second surface; and a transfer gate on a first side of the floating diffusion region, the transfer gate including a gate dielectric adjacent to the floating diffusion region in a first direction and adjacent to the photoelectric conversion device in a second direction, perpendicular to the first direction, the first and second directions parallel to the first surface.

17. The image sensor of claim 16, further comprising:
at least one of a source follower transistor, a reset transistor, and a selection transistor.

18. The image sensor of claim 16, further comprising:
a color filter on the first surface; and
a micro lens on the color filter.

19. The image sensor of claim 16, further comprising:
a deep device isolation layer on a side of the unit pixel and extending in the first direction, and contacting the first surface.

20. The image sensor of claim 19, further comprising:
a shallow device isolation layer connected to the deep device isolation layer and contacting the second surface.

* * * * *